(12) United States Patent
Ganapol et al.

(10) Patent No.: US 10,620,236 B2
(45) Date of Patent: Apr. 14, 2020

(54) MULTI-TEST TYPE PROBE CARD AND CORRESPONDING TESTING SYSTEM FOR PARALLEL TESTING OF DIES VIA MULTIPLE TEST SITES

(71) Applicant: Marvell World Trade Ltd., St. Michael (BB)

(72) Inventors: David Ganapol, Scotts Valley, CA (US); Michael Gonia, San Jose, CA (US); Scott Wu, San Jose, CA (US); Marc Jacobs, Redwood City, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 145 days.

(21) Appl. No.: 15/996,681

(22) Filed: Jun. 4, 2018

(65) Prior Publication Data

US 2018/0356444 A1 Dec. 13, 2018

Related U.S. Application Data

(60) Provisional application No. 62/518,412, filed on Jun. 12, 2017.

(51) Int. Cl.
| | |
|---|---|
| *G01R 31/00* | (2006.01) |
| *G01R 1/073* | (2006.01) |
| *G01R 35/00* | (2006.01) |
| *G01R 31/28* | (2006.01) |
| *G01R 1/04* | (2006.01) |
| G01R 3/00 | (2006.01) |
| G01R 31/26 | (2020.01) |

(52) U.S. Cl.
CPC ....... *G01R 1/07307* (2013.01); *G01R 1/0408* (2013.01); *G01R 31/2808* (2013.01); *G01R 31/2886* (2013.01); *G01R 31/2887* (2013.01); *G01R 31/2889* (2013.01); *G01R 31/2891* (2013.01); *G01R 31/2893* (2013.01); *G01R 35/00* (2013.01); *G01R 1/07342* (2013.01); G01R 3/00 (2013.01); G01R 31/2601 (2013.01); G01R 31/287 (2013.01); G01R 31/2884 (2013.01)

(58) Field of Classification Search
CPC ............ G01R 31/2891; G01R 31/2887; G01R 31/2893; G01R 31/2886; G01R 1/0408; G01R 31/2889; G01R 31/2808; G01R 3/00; G01R 31/2601; G01R 31/2884
USPC ......... 324/71, 378, 403, 415, 425, 500, 537, 324/750.16
See application file for complete search history.

(56) References Cited

U.S. PATENT DOCUMENTS 9,664,733 B2  5/2017  Ozawa et al.
9,910,089 B2  3/2018  Washio et al.
(Continued)

*Primary Examiner* — Raul J Rios Russo

(57) ABSTRACT

A probe card for testing dies of a substrate during a wafer sort process includes a printed circuit board (PCB) and a test site arranged to connect respectively to one of the dies during a test cycle. The test site includes a first pin connecting band and a first pin set. The first pin connecting band is connected to the PCB. The first pin set is connected to the first pin connecting band and includes a pin configuration for a testing device to perform a first type of test on a first die. The test site includes only pins in the first pin set. A number of pins in the first pin set is less than a number of pins used to perform a second type of test on the first die. The second type of test is performed at a slower processing speed than the first type of test.

20 Claims, 5 Drawing Sheets

(56) References Cited

U.S. PATENT DOCUMENTS

| | | | |
|---|---|---|---|
| 2007/0063721 A1* | 3/2007 | Dozier, II | G01R 31/2889 324/750.14 |
| 2009/0045827 A1* | 2/2009 | Gangoso | G01R 1/07314 324/755.01 |
| 2010/0244873 A1* | 9/2010 | Dozier, II | G01R 31/2889 324/762.03 |

* cited by examiner

MULTI-TEST TYPE PROBE CARD AND CORRESPONDING TESTING SYSTEM FOR PARALLEL TESTING OF DIES VIA MULTIPLE TEST SITES

CROSS-REFERENCE TO RELATED APPLICATIONS

This application claims the benefit of U.S. Provisional Application No. 62/518,412, filed on Jun. 12, 2017. The entire disclosure of the application referenced above is incorporated herein by reference.

FIELD

The present disclosure relates to wafer sort processes.

BACKGROUND

A wafer sort process is generally implemented via a prober, a tester and a probe card to test circuits of a wafer prior to blade singulation (or dicing) and packaging. After dicing, the individual circuits and corresponding areas of the wafer are typically referred to as dies. Hereinafter, the circuits and corresponding areas of a wafer prior to dicing may be referred to as "the dies of the wafer" or simply "the dies". During the wafer sort process, the probe card is connected to the tester, positioned on a card holder of the prober, and disposed over a substrate support. The probe card includes pins that touch down on pads and/or contacts of the dies. Power and test signals are provided by the tester to one or more dies under test. The tester monitors statuses of the pins and/or receives response signals from the dies under test. Each die on the substrate may be tested and results are recorded in a table (referred to as a "wafer map"). The table includes values respectively for the dies, where each of the values indicates, for example, whether the corresponding die passed or failed the test. Subsequent to dicing, the dies that passed are packaged, whereas the dies that failed are discarded.

SUMMARY

A probe card for testing dies of a substrate during a wafer sort process is provided. The probe card includes a printed circuit board and a first test site. The first test site is arranged to connect respectively to a selected one of the dies during a test cycle. The first test site includes a first pin connecting band and a first pin set. The first pin connecting band is connected to the printed circuit board. The first pin set is connected to the first pin connecting band of the first test site. The first pin set includes a pin configuration for a testing device to perform a first type of test on a first die. The first test site includes pins in the first pin set and no other pins. A number of pins in the first pin set is less than a number of pins used to perform a second type of test on the first die. The second type of test is performed at a slower processing speed than the first type of test.

In other features, the probe card further includes a second test site. The second test site includes a second pin connecting band and a second pin set. The second pin connecting band is connected to the printed circuit board. The second pin set is connected to the second pin connecting band of the second test site. The second pin set includes a pin configuration for the testing device to perform the first type of test or the second type of test on a second die. In other features, the second pin set includes a full set of pins in order to perform the second type of test on the second die. The second pin set includes more pins than the first pin set.

In other features, a testing system is provided and includes the probe card, the testing device, a processor, a memory, and a multi-test type probe application. The testing device connected to the probe card, supplying power to the probe card, and receiving a status signal from the first die via the probe card, where the status signal indicates a result of a built-in-self-test performed by the first die during the first type of test. The multi-test type probe application stored in the memory and including instructions, which are executable by the processor and that are to: position the probe card relative to the substrate; initiate the first type of test including providing power to the first die; and receive the status signal from the first die and store the result of the built-in-self-test in the memory.

In other features, during the first type of test, the first die is operated within a predetermined range of a maximum processing speed of the first die. In other features, the probe card includes a second test site. The second test site includes a second pin connecting band and a second pin set. The second pin connecting band is connected to the printed circuit board. The second pin set is connected to the second pin connecting band of the second test site. The second pin set includes a pin configuration for the testing device to perform the first type of test or the second type of test. The instructions are further to: test the first die with the first test site during a first test cycle; and test the first die with the second test site during a second test cycle.

In other features, the instructions are further to: test each die in a portion of the dies using the first test site; and test each die in the portion of the dies using the second test site. In other features, the probe card includes test sites. The test sites include the first test site and the second test site. The test sites are arranged in a diagonal pattern, a cross pattern or a linear pattern.

In other features, a probe card for testing dies of a substrate during a wafer sort process is provided. The probe card includes a printed circuit board and test sites. The test sites are arranged to connect respectively to the dies. The test sites include a first test site, a second test site, pin connecting bands, a first pin set, and a second pin set. The pin connecting bands are connected to the printed circuit board. The pin connecting bands include a first pin connecting band and a second pin connecting band. The first pin set is connected to the first pin connecting band of the first test site. The first pin set includes a pin configuration for a testing device to perform a first type of test on a first die. The second pin set is connected to the second pin connecting band of the second test site. The second pin set includes a pin configuration for the testing device to perform a second type of test on a second die. The second pin set includes more pins than the first pin set. The second die is operated at a slower processing speed during the second type of test than the first die is operated during the first type of test.

In other features, the first pin set includes power supply pins and status pins and does not include pins for contacting contacts of a loop back module of the first die. The second pin set includes supply pins, status pins and pins for contacting contacts of a loop back module of the second die. In other features, the test sites are arranged in a diagonal pattern, a cross pattern or a linear pattern.

In other features, a testing system is provided and includes the probe card, the testing device, a processor, a memory, and a multi-test type probe application. The testing device is connected to the probe card, supplies power to the probe card, and receives via the probe card a first status signal from the first die and a second status signal from the second die. The first status signal indicates a result of a built-in-self-test performed by the first die during the high-speed test. The second status signal indicates a state of at least a portion of the second die. The multi-test type probe application is stored in the memory and including instructions, which are executable by the processor and that are to: position the probe card relative to the substrate; initiate the first type of test and the second type of test including providing power to the first die and the second die; receive the first status signal from the first die; receive the second status signal from the second die; store the result of the built-in-self-test in the memory; and determine a result of the second type of test based on the second status signal.

In other features, the instructions are further to: test each die in a portion of the dies using the first test site; and test each die in the portion of the dies using the second test site. In other features, the instructions are further to: test a first portion of the dies using the test sites during a first test cycle; and test a second portion of the dies using the test sites during a second test cycle.

In other features, a wafer sort method is provided for testing dies of a substrate via a probe card. The probe card includes a first test sites and second test sites, where the first test sites are configured for performing a first test. The second test sites are configured for performing a second test. The second test is different than the first test. Each of the test sites includes a respective pin set. The method includes: aligning the substrate relative to the probe card, such that the first test sites are over first dies and the second test sites are over second dies; touching down pins of the pin sets onto contacts of the dies; initiating the first test on the first dies via the first test sites; initiating the second test on the second dies via the second test sites, where the second test is performed while the first test is performed; receiving first results of the first test from the first dies via the probe card; receiving status signals from the second dies via the probe card during the second test; determining second results of the second test for the second dies based on the status signals; mapping the first results and the second results to a wafer map; and reporting the wafer map to prevent packaging and further testing of one or more of the dies that failed at least one of the first test or the second test.

In other features, the first test is a high-speed test; and the first test is performed at a faster processing speed than the second test. In other features, the pin sets of the first test sites include fewer pins than the pin sets of the second test sites.

In other features, the method further includes: for the first test, supplying power to the first dies, monitoring status contacts of the first dies, and not monitoring contacts of loop back modules of the first dies; and for the second test, supplying power to the second dies and monitoring status contacts of the first dies and contacts of loop back modules of the second dies. In other features, initiating the first test on the first dies includes initiating built-in-self-tests on the first dies; and the first results indicate whether the first dies passed or failed the built-in-self-tests.

In other features, the method further includes subsequent to completing the first test on the first dies and the second test on the second dies, moving the substrate relative to the probe card, such that the first test sites are over third dies and the second test sites are over fourth dies. At least one of (i) the third dies include one or more of the second dies, or (ii) the fourth dies include one of more of the first dies. The method further includes initiating testing of the third dies and the fourth dies.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
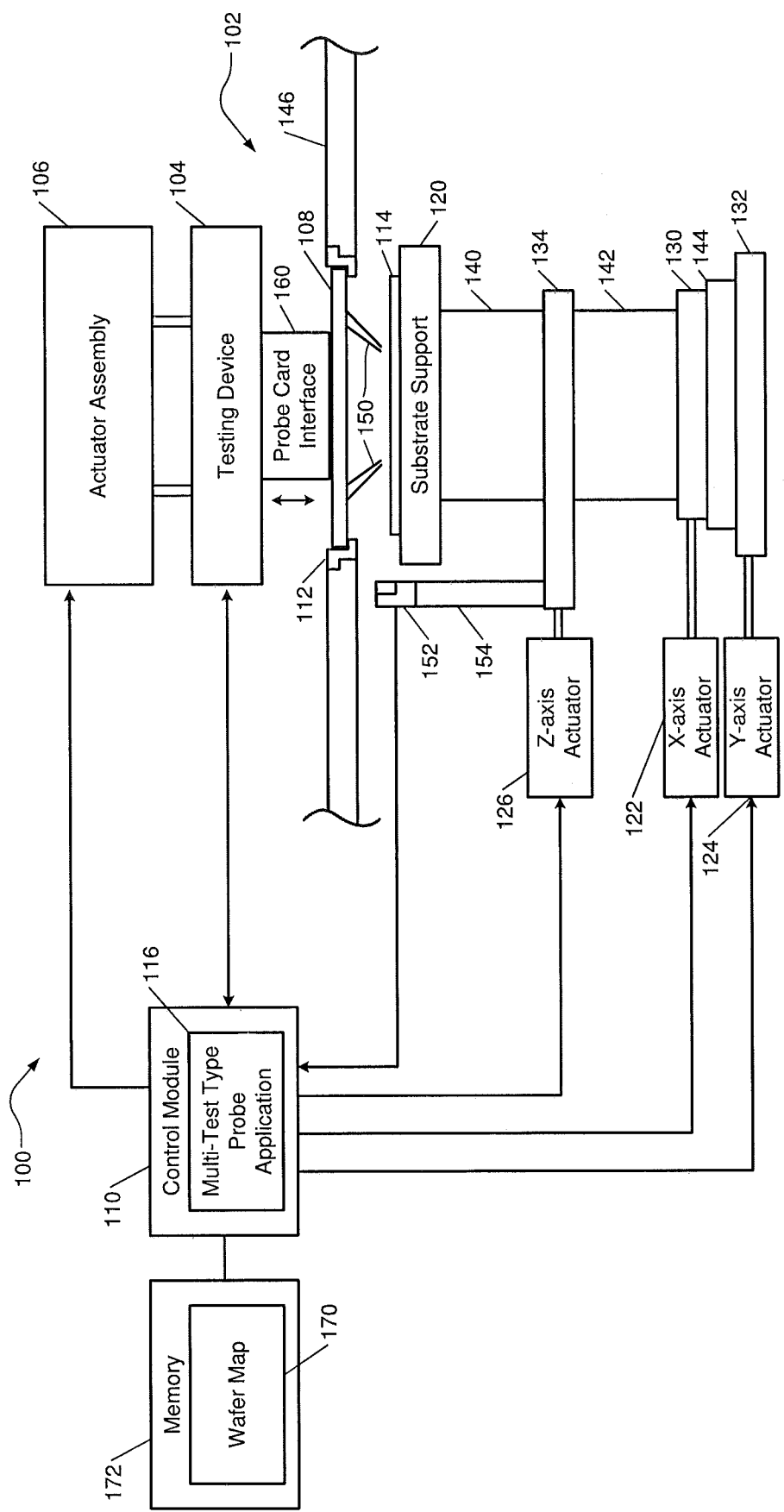
FIG. 1 is a functional block diagram of an example of a testing system including a control module with a multi-test type probe application in accordance with an embodiment of the present disclosure.

A substrate (also referred to as a wafer) may include numerous dies prior to dicing. Note that a substrate in the field of electronics is either a semiconductor or an electrical insulator, depending on the fabrication process that is being used. For the cases in which an insulator such as silicon oxide or aluminum oxide is used as the substrate, a thin layer of semiconducting material, usually pure silicon, is placed on top of the oxide. Next, using the standard photographic processes repeatedly, transistors and diodes are fabricated in the semiconductor. Testing of each of the dies individually is time consuming. To decrease testing time, multiple dies of a substrate may be tested during a same period of time. Although this allows for simultaneous testing of multiple dies, the speed at which the dies can be tested is limited and is typically at a slower speed than a maximum processing speed of the dies being tested. This is due to the number of pins extending between a probe card and the dies being tested, the length of the pins, the number of pins being monitored, the number of signals being transmitted to and from the dies, etc.

Traditionally, dies were not tested at high-speed (e.g., speeds at or near a maximum processing speed of the dies) until after dicing. Dies are typically packaged and then tested at high-speed. As a result, faults that are detected during high-speed testing are not detected until post packaging testing. It is time consuming and costly to package and test dies. To avoid wasted time and expense, the examples set forth herein include high-speed testing during wafer sort processes.

The examples include parallel testing dies during each test cycle of a wafer sort process using a multi-test type pattern. The multi-test type pattern refers to the testing of a first portion of the dies using a first type of a test (e.g., a high-speed test) and a second portion of the dies using a second type of test (e.g., a full test). As referred to herein, a high-speed test includes testing a die at or near a maximum processing speed of the die. For example, low power double date rate four (LPDDR4) random access memory (RAM) may have a maximum processing speed of 4 gigabits per second (Gb/s). A high-speed test of a LPDDR4 RAM die may be greater than or equal to 3.6 Gb/s. A high-speed test includes touching down with a subset of preselected pins on a subset of pads (or contacts) of one or more dies. As an example, a predetermined set of pins may be used to only provide power, initiate a test and/or receive a test result. During a high-speed test, the dies under the high-speed test perform built-in-self-tests (BISTs) and provide results back to a tester. This is further described below.

A full test refers to touching down on one or more dies with full sets of pins and performing a full set of tests to determine whether the one or more dies pass or fail. A full test may include touching down on all pads and/or other contacts of a die and testing pad leakage, scanning through and testing each memory element, performing static parasitic tests to determine whether circuit elements (e.g., diodes, transistors, metal lines, etc.) are connected correctly, and/or performing other tests. Relative to a high-speed test, a full test includes a greater number of pins, includes a greater number of tests, and is performed at a slower speed. For at least these reasons, a full test may require a longer time to complete than a high-speed test.

FIG. 1 shows a testing system 100 that includes a prober 102, a testing device (or tester) 104, an actuator assembly 106, a probe card 108 and a control module 110. The prober 102 and the testing device 104 are provided as examples. The embodiments disclosed herein may be applied to other probers and testing devices. The prober 102 is used to position and align substrates for testing dies of the substrate. The actuator assembly 106 may be included and is used to move the testing device 104 and probe card 108. The probe card 108 may be placed on a card holder 112 of the prober 102 via the actuator assembly 106 and used to test dies on a substrate 114. The control module 110 controls operation of the prober 102, the testing device 104, and the actuator assembly 106 and includes a multi-test type probe application 116.

The multi-test type probe application 116 may be implemented in, stored in and/or executed by the control module 110 and/or in the testing device 104. The multi-test type probe application 116 controls operation of the testing device 104 to perform multiple different tests on multiple dies of the substrate 114 during a same period of time. Multiple different tests (e.g., high-speed tests and full tests) may be performed. The high-speed test may be performed while the full speed tests are performed. The high-speed tests for two or more dies may be performed simultaneously. The full speed tests for two or more dies may be performed simultaneously.

The prober 102 includes a substrate support 120, which may be moved in multiple directions relative to the card holder 112 and/or the probe card 108 via actuators 122, 124, 126. The actuators 122, 124, 126 may be respectively x-axis, y-axis, and z-axis actuators. The actuators 122, 124, 126 may be used to move non-rotating members 130, 132, 134 in x, y and z directions. The substrate support 120 may be rotated via a rotating member 140 that is disposed between the substrate support 120 and the non-rotating member 134. A support member 142 may be disposed between the non-rotating members 134, 130. A second support member 144 may be disposed between the non-rotating members 130, 132. The prober 102 includes walls (e.g., wall 146). The card holder 112 is configured to be disposed in an opening in the wall 146. In one embodiment, substrate support 120, the actuators 122, 124, 126, and the members 130, 132, 134, 140, 142, 144 are disposed in the prober 102.

The substrate 114 is placed on the substrate support 120. The control module 110 may align the substrate 114 relative to the probe card 108, pins 150 of the probe card 108, and/or the card holder 112 based on images received from one or more cameras (e.g., camera 152). As an example, the camera 152 is mounted on a stand 154, which is attached to the non-rotating member 134.

Figure 5:
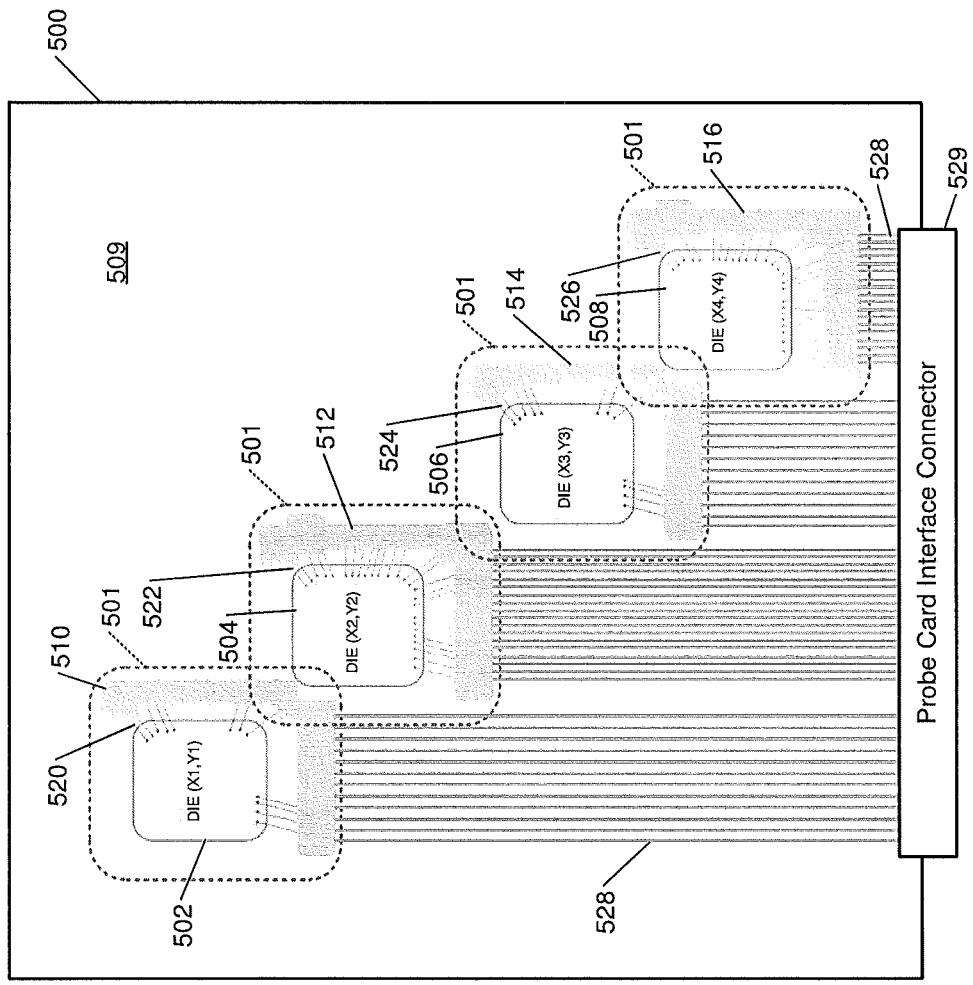
FIG. 5 is a top view illustrating a diagonal test site pattern and corresponding structure for a portion of a probe card over a predetermined set of dies and in accordance with an embodiment of the present disclosure.

In one implementation, the testing device 104 is connected to the probe card 108 via a probe card interface 160. The probe card interface 160 connects to a probe card connector on the probe card 108. An example of a probe card connector is shown in FIG. 5. Although the testing device 104 is shown as being connected to a particular contact ring and probe card, the testing device 104 may be connected to other contact rings and probe cards. The testing device 104 and/or the control module 110 may monitor and/or collect data from the dies under test, process the data, and provide probing results. This may include creating and updating a wafer map 170 and indicating which dies passed and which dies failed during testing. The wafer map 170 may be stored in a memory 172, which may be accessible to the control module 110, as shown, and/or the testing device 104. The testing device 104 and the control module 110 may have an internal memory and/or may access the memory 172. The multi-test type probe application 116 may be stored in the internal memory of the testing device 104, the internal memory of the control module 110, or the memory 172.

Figure 2:
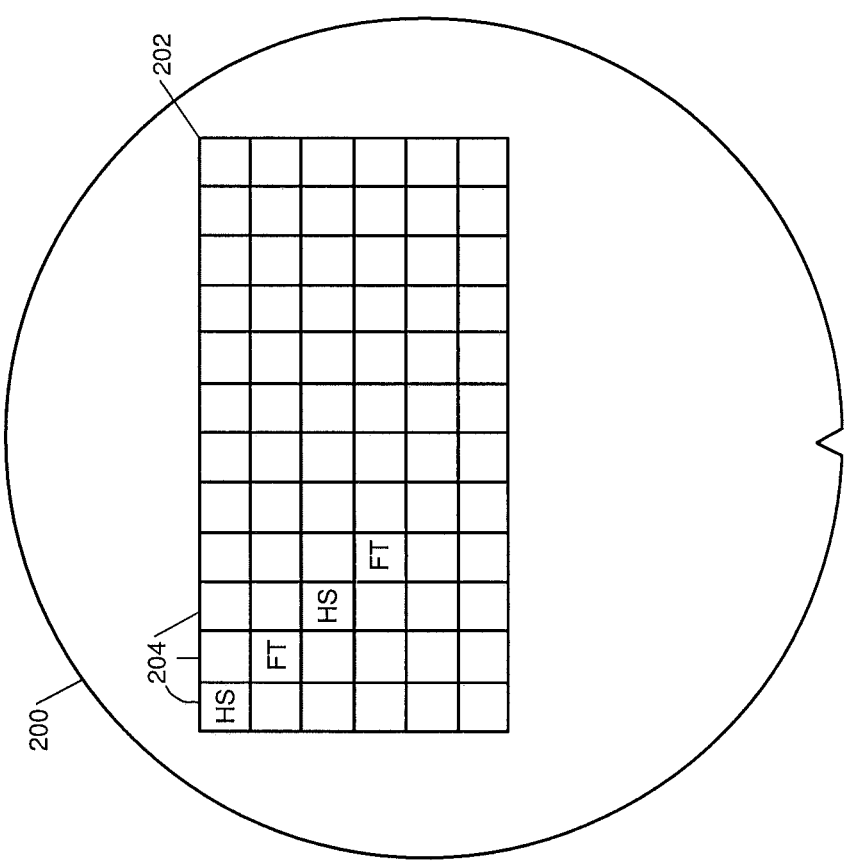
FIG. 2 is a top view of an example of a substrate showing a portion of corresponding dies and illustrating a multi-test type site pattern for a test cycle in accordance with an embodiment of the present disclosure.

FIG. 2 shows a substrate 200 including a portion 202 of dies 204. In the example shown, the dies 204 are in rows and columns and thus in a grid pattern. Four test sites are identified with an HS or a FT, where HS refers to a high-speed test being performed and FT refers to a full test being performed. In the example shown, two dies are under a high-speed test and two other dies are under a full test. The test sites include sets of pins of a probe card, where each set of pins is configured to touch down on a respective die during a single test cycle (or test period). For example, the probe card 108 of FIG. 1 may have 4 test sites arranged in a diagonal pattern as shown in FIG. 2. The pins of the four test sites may touch down on a first set of four dies as shown. During a first test cycle, the first four dies are tested (e.g., two are tested under a high-speed test and the other two are tested under a full test). The probe card 108 is moved relative to the substrate 200 or the substrate 200 is moved relative to the probe card 108 for a next test. During a second test cycle, a second set of four dies are tested. As an example the next set of four dies may be adjacent to the first set of four dies. The second set of four dies may be in same rows or in same columns as the first set of four dies. The second set of four dies may include one or more of the first set of four dies.

Figure 3:
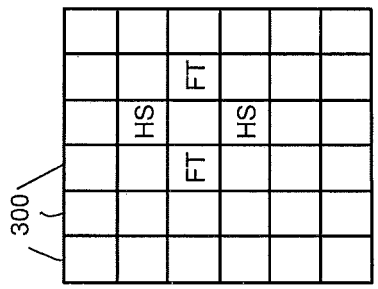
FIG. 3 is a top view of a portion of dies of a substrate illustrating an example of a cross test site pattern in accordance with an embodiment of the present disclosure.
Figure 4:
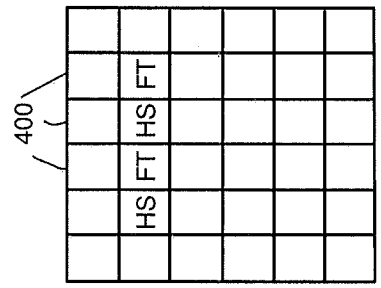
FIG. 4 is a top view of a portion of dies of a substrate illustrating an example of a linear test site pattern in accordance with an embodiment of the present disclosure.

Although four test sites are shown as testing 4 dies during a single test cycle, any number of test sites may be used to test a corresponding number of dies during each test cycle. Also, although FIG. 2 shows the test sites being in a diagonal pattern, the test sites may be in a cross pattern, a linear pattern, and/or other pattern. FIG. 3 shows a portion of dies 300 of a substrate illustrating a cross test pattern, where four test sites are arranged in a cross pattern and used to test four dies during each test cycle. FIG. 4 shows a portion of dies 400 of a substrate illustrating a linear test pattern, where four test sites are arranged in a linear pattern and used to test four dies during each test cycle.

FIG. 5 shows a portion of a probe card 500 that includes a diagonal pattern of test sites 501 that may be disposed over a predetermined set of dies (e.g., dies 502, 504, 506, 508). The probe card 500 may be configured differently to have test sites arranged in other patterns, such as a cross pattern or a linear pattern. The probe card 108 of FIG. 1 may be configured similar as the probe card 500. The probe card 500 includes a printed circuit board (PCB) 509 and pin connecting bands 510, 512, 514, 516 corresponding respectively to the test sites 501. Each of the pin connecting bands 510, 512, 514, 516 may connect pins (e.g., pin sets 520, 522, 524, 526) to, for example, the conductive elements 162 of FIG. 1. The test sites are offset from each other in both a first (or X) direction and a second (or Y) direction. The test sites are arranged to be over diagonally adjacent dies of a substrate, where the dies are arranged in rows and columns.

FIG. 5 shows two types of pin connecting bands; two pin connecting bands for high-speed tests and two pin connecting bands for full tests. The pin sets 520, 524 include a sub-set (or reduced set) of pins and are for performing the high-speed tests. The pin sets 522, 526 include a full set of pins and are used for the full tests. In one embodiment, the pins used for the high-speed tests are longer than the pins used for the full tests. Although a particular number of pins are shown for each of the pin sets 520, 522, 524, 526, each of the pin sets 520, 522, 524, 526 may include a different number of pins. Also, although the pin sets 520, 522, 524, 526 are shown as being located on two sides of the dies 502, 504, 506, 508, the pins may be on any number of sides of the dies 502, 504, 506, 508. The pin connecting bands 510, 512, 514, 516 may include conductive elements connecting traces 528 to the pins in the pin sets 520, 522, 524, 526. The traces 528 connect the conductive elements in the pin connecting bands 510, 512, 514, 516 to a probe card interface connector 529, which may be connected to the probe card interface 160 of FIG. 1. Although a certain number, style and pattern of traces are shown, any number of traces may be included, the traces may be of a different style than shown, and the traces may be in a different pattern than shown. Also, the traces 528 may be connected to other portions of the pin connecting bands 510, 512, 514, 516 than as shown. In FIG. 5, not all traces are shown for the pin connecting bands 512, 516.

First ends of the pins in the pin sets 520, 522, 524, 526 may touch down on pads of the dies 502, 504, 506, 508 and/or contact other conductive elements of the dies 502, 504, 506, 508. Second ends of the pins are connected to the pin connecting bands 510, 512, 514, 516. The pins of the probe card 500 may be configured to touch down on high-speed pads of dies, such as LPDDR4 pads or peripheral component interconnect express (PCIe) generation 3 pads.

Figure 6:
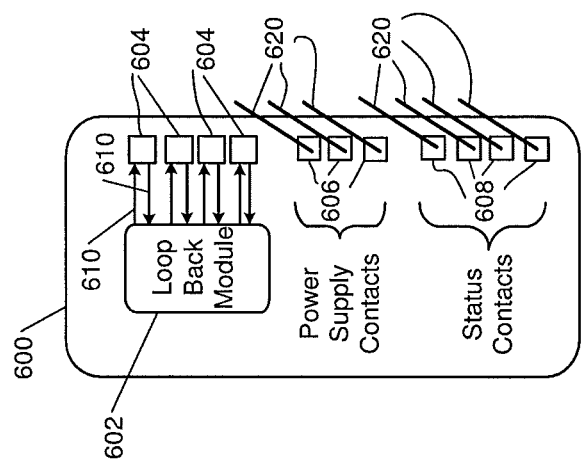
FIG. 6 is a top view of an example of a portion of a die connected to perform a high-speed test in accordance with an embodiment of the present disclosure.

FIG. 6 shows a portion of a die 600 connected to perform a high-speed test. The die 600 includes a loop back module 602, loop back pads 604, power supply pads 606, and status pads 608. The loop back module 602 is configured to perform a loop back test during a high-speed test. The loop back module 602 provides signals to and receives the signals back from the loop back pads 604 via conductive lines 610. In one embodiment, the signals are returned back to the loop back module 602 are used by the loop back module 602 during a BIST. The BIST is a high-speed test performed by the loop back module 602 and/or the die 600. As an example, power is supplied to the power supply pads 606. The loop back module 602 in response to receiving the power, in response to receiving one or more certain voltages on the power supply pads 606, and/or in response to a signal received on the status pads 608 initiates the BIST. Results of the BIST are provided on one or more of the status pads 608. In an embodiment, the die 600 provides only a single result back indicating whether the die 600 passed or failed the BIST.

The loop back pads 604 further reduce the number of pins contacting the die 600 for a high-speed test. As shown, pins 620 are in contact with the power supply pads 606 and the status pads 608, but are not in contact with the loop back pads 604. No pins are in contact with the loop back pads 604. In this configuration, the testing device 104 and/or the control module 110 of FIG. 1 does not monitor states of the loop back pads 604 and does not provide signals to the loop back pads 604. The power supply pads 606 include power and reference potential (or ground) pads.

By not having pins contacting the loop back pads 604, associated parasitic resistances, inductances and capacitances from the probe card 108 and/or the testing device 104 are eliminated for the loop back pads 604. The elimination of associated parasitic resistances, inductances and capacitances allows the die 600 to operate at or near a maximum processing speed. Also, the reduced number of pins further allows the die 600 to operate at or near the maximum processing speed of the die 600 during the high-speed test since there is less signals and/or data are being received and/or transmitted. In addition, with a reduced number of pins, there is less inductance noise. The die 600 may be configured to or instructed to operate at or near the maximum processing speed when the BIST is initiated.

Figure 7:
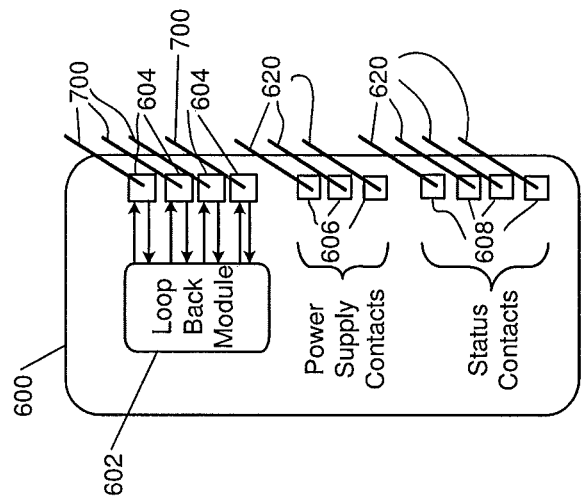
FIG. 7 is a top view of the portion of the die of FIG. 6 connected to perform a full-test in accordance with an embodiment of the present disclosure.

FIG. 7 shows the portion of the die 600 of FIG. 6 connected to perform a full test. The full test may be performed as described above. In an embodiment, the full test does not include a BIST. The die 600 is shown including the loop back module 602, the loop back pads 604, the power supply pads 606 and the status pads 608. During the full test, additional pads and/or contacts of the die 600 may be in contact with pins not shown in FIG. 7. As shown, pins 700 are in contact with the loop back pads 604 and the pins 620 are in contact with the power supply pads 606 and the status pads 608. In this configuration, the testing device 104 and/or the control module 110 of FIG. 1 may monitor the state of the loop back pads 604 and/or provide signals to the loop back pads 604. During a full test, a transitional delay fault may be generated due to an error detected when transitioning a clock from a first domain to a second domain while propagating a signal at high speed between terminals, such as between an input terminal and an output terminal. The terminals may be internal to the die 600 or refer to certain pads and/or contacts of the die 600.

Figure 8:
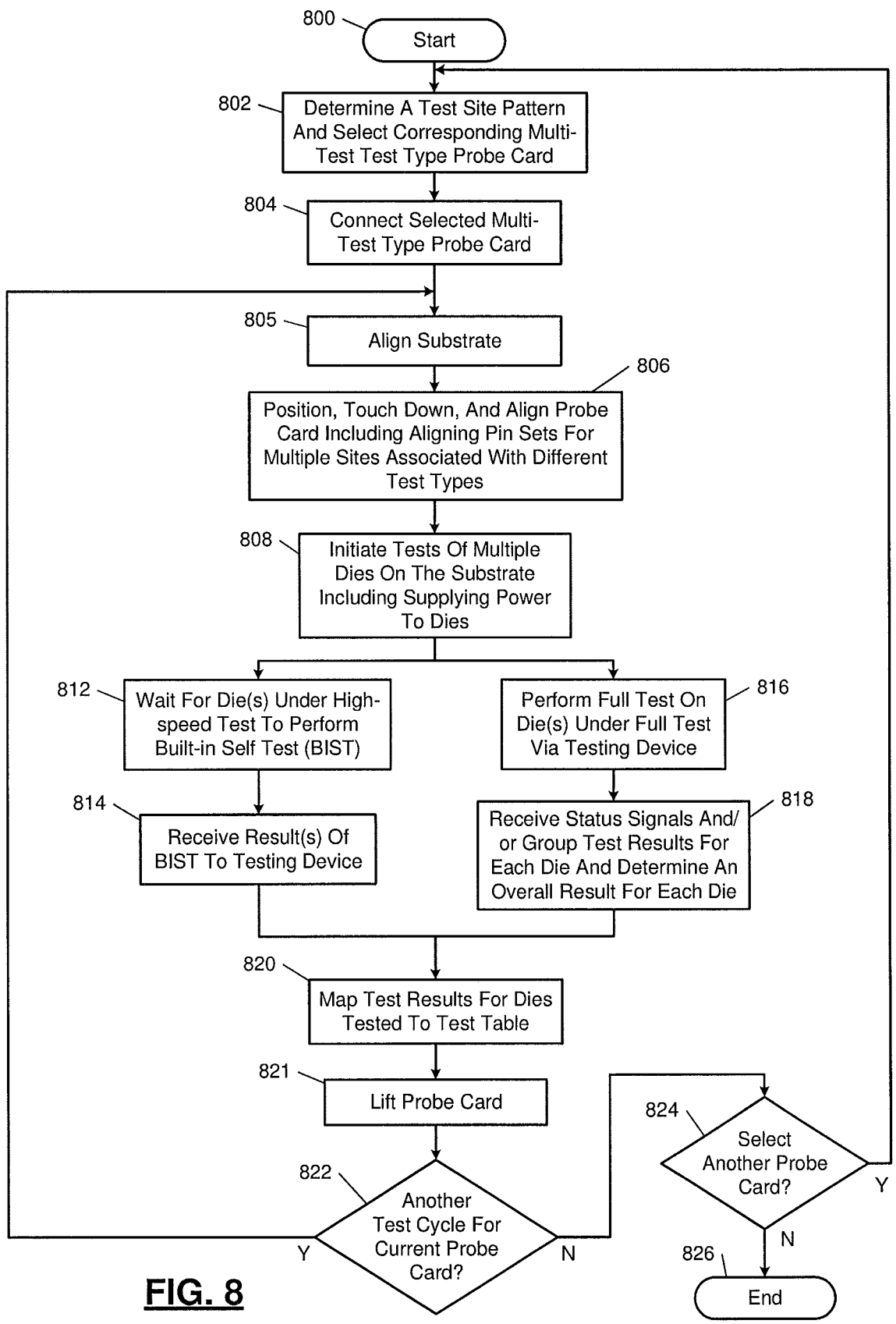
FIG. 8 illustrates a wafer sort method in accordance with an embodiment of the present disclosure.

The probe cards and corresponding test systems disclosed herein may be operated using numerous methods, an example method is illustrated in FIG. 8. FIG. 8 shows a wafer sort method. Although the following operations are primarily described with respect to the implementations of FIGS. 1-7, the operations may be easily modified to apply to other implementations of the present disclosure. The operations may be iteratively performed. The operations may be performed by the testing device 104 and/or the control module 110. In one embodiment, the control module 110 executes the multi-test type probe application 116 and initiates and controls testing operations via the testing device 104, the actuator assembly 106 and/or the actuators 122, 124, 126.

The method may begin at 800. At 802, the multi-test type probe application 116 determines a test site pattern and selects a corresponding multi-test type probe card (e.g., one of the probe cards 108, 500). As an example, the test site pattern may be a parallel high-speed test and full test pattern, such as that shown in FIGS. 2-4. Multiple probe cards may be available and one may be selected. The actuator assembly 106 and/or the testing device 104 may be used to drop off a first (or previously used) probe card and select a second (or next) probe card. A different testing device and/or contact ring may be used for different probe cards.

At 804, the selected one of the probe cards is connected. This may include: connecting the probe card interface 160 to the selected probe card; connecting the testing device to the probe card interface 160; and/or connecting the testing device 104 to the actuator assembly 106 and/or the control module 110.

At 805, a substrate under test may be aligned via, for example, the actuators 122, 124, 126 and the camera 152. At 806, the probe card is positioned over the substrate and the pins of the probe card aligned with the pads and/or contacts of the dies of the substrate to be tested for a current test cycle. The probe card is moved in a vertical direction to touch down the pins on the corresponding pads and/or contacts of the dies under test. The pins of multiple sites may be used to test multiple dies. Different types of tests may be performed on different dies. For example, a high-speed test may be performed on a first predetermined number of dies and a full test may be performed on a second predetermined number of dies. In one embodiment, the first predetermined number is equal to the second predetermined number.

At 808, the multi-test type probe application 116 initiates tests of the dies including supplying power to the dies. The dies that are to perform the high-speed test may then perform BISTs.

At 812, the multi-test type probe application 116 waits for the dies performing the high-speed test to complete the BISTs. At 814 and upon completion of the BISTs, the multi-test type probe application 116 receives test results from the dies performing the high-speed test. The test results may be stored in the memory 172.

At 816, the multi-test type probe application 116 performs the full test including transmitting signals to and receiving signals from the dies under the full test. At 818, the multi-test type probe application 116 may, for each of the dies under the full test, receive status signals, receive test results, group the test results, and/or determine an overall test result. The overall test result may be determined based on the received signals and/or test results. The received signals and/or test results are thus grouped by die and may be stored in the memory 172. The overall test results may indicate whether the dies failed or passed the corresponding tests. The overall test results may also be stored in the memory 172.

At 820, the multi-test type probe application 116 maps the test results for the dies tested to the wafer map 170. The wafer map 170 may indicate based on the received results which of the dies passed and which of the dies failed. At 821, the probe card 108 may be lifted off the substrate. Subsequent to or while performing the method of FIG. 8, the control module 110 may report the results of the tests to network devices associated with dicing, packaging and/or post packaging testing. By mapping, recording and reporting the test results, the control module 110 prevents packaging and further testing of dies identified as failing one or more high-speed and/or full tests. This may include transmitting signals from the control module 110 to a test monitoring device and/or other network device used in dicing, packaging and post packaging testing operations.

At 822, the multi-test type probe application 116 determines whether another test cycle is to be performed using the current probe card. If another test cycle is to be performed, operation 805 may be performed to move the substrate and/or the probe card to test the next set of dies, otherwise operation 824 may be performed. Each of the dies of the substrate may be tested two or more times as (i) the sites of the probe card are moved laterally relative to the substrate, or (ii) the substrate is moved laterally relative to the sites of the probe card.

At 824, the multi-test type probe application 116 determines whether to select another probe card. If another probe card is to be selected, operation 802 is performed, otherwise the method may end at 826.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A probe card for testing a plurality of dies of a substrate during a wafer sort process, the probe card comprising:
   a printed circuit board; and
   a first test site arranged to connect respectively to a selected one of the plurality of dies during a test cycle, wherein the first test site comprises
      a first pin connecting band connected to the printed circuit board, and
      a first pin set connected to the first pin connecting band of the first test site, wherein the first pin set includes a pin configuration for a testing device to perform a first type of test on a first die, wherein the first test site includes pins in the first pin set and no other pins, wherein a number of pins in the first pin set is less than a number of pins used to perform a second type of test on the first die, and wherein the second type of test is performed at a slower processing speed than the first type of test.

2. The probe card of claim 1, further comprising a second test site, wherein the second test site comprises:
   a second pin connecting band connected to the printed circuit board; and
   a second pin set connected to the second pin connecting band of the second test site, wherein the second pin set includes a pin configuration for the testing device to perform the first type of test or the second type of test on a second die.

3. The probe card of claim 2, wherein:
the second pin set includes a full set of pins in order to perform the second type of test on the second die; and
the second pin set includes more pins than the first pin set.

4. A testing system comprising:
the probe card of claim 1;
the testing device connected to the probe card, supplying power to the probe card, and receiving a status signal from the first die via the probe card, wherein the status signal indicates a result of a built-in-self-test performed by the first die during the first type of test;
a processor;
a memory; and
a multi-test type probe application stored in the memory and including instructions, which are executable by the processor and that are to
position the probe card relative to the substrate,
initiate the first type of test including providing power to the first die, and
receive the status signal from the first die and store the result of the built-in-self-test in the memory.

5. The testing system of claim 4, wherein, during the first type of test, the first die is operated within a predetermined range of a maximum processing speed of the first die.

6. The testing system of claim 4, wherein:
the probe card comprises a second test site;
the second test site comprises
a second pin connecting band connected to the printed circuit board, and
a second pin set connected to the second pin connecting band of the second test site, wherein the second pin set includes a pin configuration for the testing device to perform the first type of test or the second type of test;
the instructions are further to
test the first die with the first test site during a first test cycle; and
test the first die with the second test site during a second test cycle.

7. The testing system of claim 6, wherein the instructions are further to:
test each die in a portion of the plurality of dies using the first test site; and
test each die in the portion of the plurality of dies using the second test site.

8. The probe card of claim 6, wherein:
the probe card comprises a plurality of test sites;
the plurality of test sites include the first test site and the second test site; and
the plurality of test sites are arranged in a diagonal pattern, a cross pattern or a linear pattern.

9. A probe card for testing a plurality of dies of a substrate during a wafer sort process, the probe card comprising:
a printed circuit board; and
a plurality of test sites arranged to connect respectively to the plurality of dies, wherein the plurality of test sites comprise
a first test site,
a second test site,
a plurality of pin connecting bands connected to the printed circuit board, wherein the plurality of pin connecting bands comprise a first pin connecting band and a second pin connecting band, a first pin set connected to the first pin connecting band of the first test site, wherein the first pin set includes a pin configuration for a testing device to perform a first type of test on a first die, and
a second pin set connected to the second pin connecting band of the second test site, wherein the second pin set includes a pin configuration for the testing device to perform a second type of test on a second die, and wherein the second pin set includes more pins than the first pin set, and wherein the second die is operated at a slower processing speed during the second type of test than the first die is operated during the first type of test.

10. The probe card of claim 9, wherein:
the first pin set includes power supply pins and status pins and does not include pins for contacting contacts of a loop back module of the first die; and
the second pin set includes supply pins, status pins and pins for contacting contacts of a loop back module of the second die.

11. The probe card of claim 9, wherein the plurality of test sites are arranged in a diagonal pattern, a cross pattern or a linear pattern.

12. A testing system comprising:
the probe card of claim 9;
the testing device connected to the probe card, supplying power to the probe card, and receiving via the probe card a first status signal from the first die and a second status signal from the second die, wherein the first status signal indicates a result of a built-in-self-test performed by the first die during the high-speed test, and wherein the second status signal indicates a state of at least a portion of the second die;
a processor;
a memory; and
a multi-test type probe application stored in the memory and including instructions, which are executable by the processor and that are to
position the probe card relative to the substrate,
initiate the first type of test and the second type of test including providing power to the first die and the second die,
receive the first status signal from the first die,
receive the second status signal from the second die,
store the result of the built-in-self-test in the memory, and
determine a result of the second type of test based on the second status signal.

13. The testing system of claim 12, wherein the instructions are further to:
test each die in a portion of the plurality of dies using the first test site; and
test each die in the portion of the plurality of dies using the second test site.

14. The testing system of claim 12, wherein the instructions are further to:
test a first portion of the plurality of dies using the plurality of test sites during a first test cycle; and
test a second portion of the plurality of dies using the plurality of test sites during a second test cycle.

15. A wafer sort method for testing a plurality of dies of a substrate via a probe card, wherein the probe card comprises a first test sites and second test sites, where the first test sites are configured for performing a first test, wherein the second test sites are configured for performing a second test, wherein the second test is different than the first test, and wherein each of the test sites comprises a respective pin set, the method comprising:

aligning the substrate relative to the probe card, such that the first test sites are over first dies and the second test sites are over second dies;

touching down pins of the pin sets onto contacts of the plurality of dies;

initiating the first test on the first dies via the first test sites;

initiating the second test on the second dies via the second test sites, wherein the second test is performed while the first test is performed;

receiving first results of the first test from the first dies via the probe card;

receiving status signals from the second dies via the probe card during the second test;

determining second results of the second test for the second dies based on the status signals;

mapping the first results and the second results to a wafer map; and reporting the wafer map to prevent packaging and further testing of one or more of the plurality of dies that failed at least one of the first test or the second test.

16. The method of claim 15, wherein:
the first test is a high-speed test; and
the first test is performed at a faster processing speed than the second test.

17. The method of claim 15, wherein the pin sets of the first test sites include fewer pins than the pin sets of the second test sites.

18. The method of claim 15, further comprising:
for the first test, supplying power to the first dies, monitoring status contacts of the first dies, and not monitoring contacts of loop back modules of the first dies; and for the second test, supplying power to the second dies and monitoring status contacts of the first dies and contacts of loop back modules of the second dies.

19. The method of claim 15, wherein:
initiating the first test on the first dies comprises initiating built-in-self-tests on the first dies; and
the first results indicate whether the first dies passed or failed the built-in-self-tests.

20. The method of claim 15, further comprising:
subsequent to completing the first test on the first dies and the second test on the second dies, moving the substrate relative to the probe card, such that the first test sites are over third dies and the second test sites are over fourth dies, wherein at least one of
the third dies include one or more of the second dies, or
the fourth dies include one of more of the first dies; and
initiating testing of the third dies and the fourth dies.

* * * * *